(12) United States Patent
Chen et al.

(10) Patent No.: US 9,825,022 B2
(45) Date of Patent: Nov. 21, 2017

(54) ESD CLAMP CIRCUIT

(71) Applicant: Semiconductor Manufacturing International (Shanghai) Corporation, Shanghai (CN)

(72) Inventors: Guang Chen, Shanghai (CN); Huijuan Cheng, Shanghai (CN); Hongwei Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 54 days.

(21) Appl. No.: 14/702,356

(22) Filed: May 1, 2015

(65) Prior Publication Data

US 2015/0318275 A1 Nov. 5, 2015

(30) Foreign Application Priority Data

May 4, 2014 (CN) .......................... 2014 1 0184890

(51) Int. Cl.
*H01L 27/02* (2006.01)

(52) U.S. Cl.
CPC ...... *H01L 27/0285* (2013.01); *H01L 27/0251* (2013.01); *H01L 27/0266* (2013.01); *H01L 27/0288* (2013.01)

(58) Field of Classification Search
CPC ............. H01L 27/0288; H01L 27/0285; H01L 27/0251; H01L 27/0266
See application file for complete search history.

(56) References Cited

U.S. PATENT DOCUMENTS

| | | | | | |
|---|---|---|---|---|---|
| 5,744,842 | A | * | 4/1998 | Ker ..................... | H01L 27/0251 257/355 |
| 5,818,087 | A | * | 10/1998 | Yee ..................... | H01L 27/0251 257/355 |
| 7,570,468 | B2 | * | 8/2009 | Bernard ................. | H02H 9/046 361/56 |
| 8,334,571 | B2 | * | 12/2012 | Tsai .................... | H01L 27/0255 257/357 |
| 8,390,360 | B2 | * | 3/2013 | Gist, III .................. | H02H 9/04 327/306 |
| 8,730,625 | B2 | * | 5/2014 | Stockinger ............. | H02H 9/046 361/56 |
| 2008/0029824 | A1 | * | 2/2008 | Baizley ............... | H01L 27/0266 257/371 |

\* cited by examiner

*Primary Examiner* — Zeev V Kitov
(74) *Attorney, Agent, or Firm* — Kilpatrick Townsend & Stockton LLP

(57) ABSTRACT

An ESD clamp circuit includes a power supply, a ground supply, an ESD detection transistor, a capacitor having a first terminal connected to the power supply and a second terminal connected to a gate of the ESD detection transistor, and a first resistor connected in series with the capacitor between the power and ground supplies. The ESD clamp circuit also includes a clamp transistor having a first terminal connected to the power supply and a second terminal connected to the ground terminal, an inverter having an input connected to a first terminal of the ESD detection transistor and an output connected to the gate of the clamp transistor, a feedback transistor connected across the inverter, and a second resistor having a first terminal connected to the gate of the clamp transistor and to a second terminal to the ground supply.

14 Claims, 2 Drawing Sheets

ESD CLAMP CIRCUIT

CROSS-REFERENCES TO RELATED APPLICATIONS

This application claims priority to Chinese patent application No. 201410184890.6, filed on May 4, 2014, the content of which is incorporated herein by reference in its entirety.

BACKGROUND OF THE INVENTION

The present invention relates to electrostatic discharge protection of semiconductor devices, and more particularly to an active ESD clamp circuit for core circuitry protection.

With the rapid development of semiconductor manufacturing technology, small-sized transistors having a thin gate oxide layer and a thin dielectric layer can easily be damaged due to electrostatic discharge. Thus, a secondary ESD protection of the core circuitry is indispensable for sub-micron modules and structures.

Integrated circuits with large feature sizes have a large number of buffer transistors configured to share an ESD current so that the amount of the ESD current flowing through each buffer transistor is manageable, so that no damage occurs. Integrated circuits with small-feature sizes do not have a sufficient number of buffer transistors to share the ESD current so that the transistors can easily be damaged. Small feature-sized (e.g., submicron) integrated circuits fully depend on the internal ESD protection circuitry to absorb the ESD current, even a relatively small ESD current can cause significant damage to the submicron circuitry. Generally, internal circuit transistors that connect to Vcc power supply and Vss ground supply may directly dissipate an ESD current because the large number of transistors can reduce the current surge. However, for small supply domains, tiny devices may fail even with an internal ESD clamp device, the reason is that the time constant for trigger an ESD clamp gate is not sufficient to keep the ESD clamp device remain turned on. Conventional internal ESD protection circuits do not have sufficient long turn-on time to fully discharge the ESD current to protect the core circuitry. Thus, increasing the turn-on time of the ESD protection circuitry is required.

In general, an ESD protection circuit is coupled between the power supply and ground supply to protect the core circuitry. An ESD protection circuit is an active device that drives the gate of an n-channel clamp transistor. The clamp transistor shunts an ESD current from the power supply to ground when its gate is driven high during an ESD event. The ESD protection circuit may include a voltage divider that generates a sense voltage to drive a first inverter. The initial input terminal ESD voltage is much lower than the threshold of a first inverter. When the ESD voltage reaches its peak value, the switching output of ESD voltage is higher than the threshold of the first inverter, whose output takes on a logic high level. The logic high level of the output of the first transistor travels through a series of inverters to turn the output of the last inverter connected to the gate of the N-channel active clamp transistor to the logic high level to turn on the N-channel clamp transistor. The output of the last extending transistor is connected between a gate of an n-MOS transistor and the input of the last inverter. This structure extends the turn-on time of the N-channel clamp transistor to increase the discharge duration of the ESD current, thereby increasing the ESD protection of the core circuitry.

Conventional ESD clamp circuits may utilize a resistor-capacitor (RC) circuit to detect the occurrence of an ESD event. The extension of the discharge time can be increased by increasing the value of the resistor and/or capacitor. However, increasing the value of the resistor and/or capacitor also increases the silicon area. Furthermore, a large value of resistor and/or capacitor may lead to a large leakage current flowing through the clamp transistor when a voltage power is on. Thus, conventional ESD protection circuits have many disadvantages and limitations that add greatly to the difficulty and cost of manufacture.

BRIEF SUMMARY OF THE INVENTION

Embodiments of the present invention provide an electrostatic discharge (ESD) clamp circuit. The ESD clamp circuit includes a power supply, a ground supply, an ESD detection transistor, a capacitor having a first terminal connected to the power supply and a second terminal connected to a gate of the ESD detection transistor, and a first resistor having a first terminal connected to the gate of the ESD detection transistor and a second terminal connected to the ground supply. The ESD clamp circuit also includes a clamp transistor having a first terminal connected to the power supply and a second terminal connected to the ground supply, an inverter having an input connected to a first terminal of the ESD detection transistor and an output connected to a gate of the clamp transistor, a feedback transistor connected across the inverter, and a second resistor having a first terminal connected to the gate of the clamp transistor and a second terminal connected to the ground supply. The feedback transistor includes a gate connected to the gate of the clamp transistor, a first terminal connected to the power supply, and a second terminal connected to the first terminal of the ESD detection transistor.

In an embodiment, the clamp transistor is an n-channel transistor having its second terminal (source) and substrate connected to the ground supply.

In an embodiment, the ESD detection transistor is an n-channel transistor having its second terminal (source) and substrate connected to the ground supply.

In an embodiment, the capacitor may be a parasitic capacitance of an n-channel transistor or a parasitic capacitance of a p-channel transistor. In another embodiment, the capacitor may be a parasitic capacitance of a metal oxide semiconductor (MOS) varactor or a parasitic capacitance of a diode.

In an embodiment, the first resistor is a polysilicon resistor, an NMOS transistor having a gate connected to the power supply, or a PMOS transistor having a gate connected to the ground supply.

In an embodiment, the feedback transistor is a p-channel transistor having the gate connected to the output of the inverter, the second terminal (drain) connected to the input of the inverter, and a substrate and the first terminal (source) of the feedback transistor are connected to the power supply.

In an embodiment, the inverter is a single stage CMOS inverter having a p-channel transistor and an n-channel transistor connected in series between the power supply and the ground supply and configured to reduce a trigger time of the ESD clamp circuit and increase a turn-on speed of the clamp transistor.

In an embodiment, the second resistor is a polysilicon resistor, an NMOS transistor having a gate connected to the power supply, a PMOS transistor having a gate connected to the ground supply, or a parasitic metal resistor.

The following description, together with the accompanying drawings, will provide a better understanding of the nature and advantages of the claimed invention.

BRIEF DESCRIPTION OF THE DRAWINGS

The accompanying drawings illustrate embodiments of the invention, and, together with the description, serve to explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
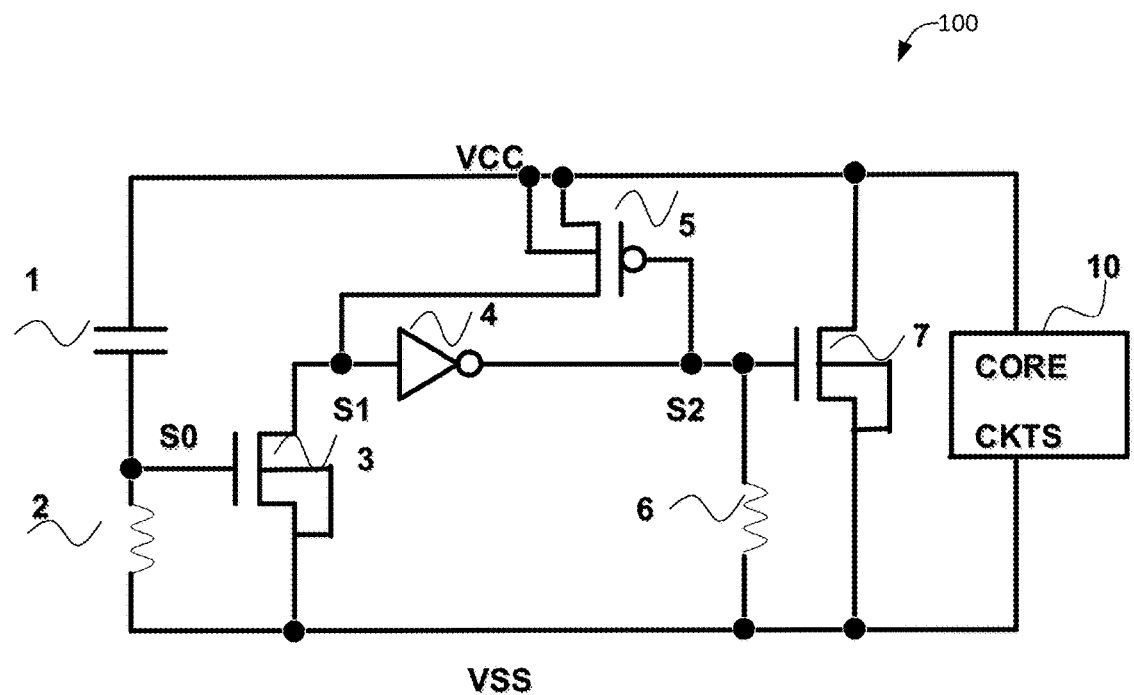
FIG. 1 is a simplified circuit diagram of an active ESD clamp circuit according to an embodiment of the present invention.

FIG. 1 is a simplified circuit diagram of an active ESD clamp circuit 100 according to an embodiment of the present invention. ESD clamp circuit 100 is shown as including a power supply VCC, a ground supply VSS, an ESD detection transistor 3, a capacitor 1 having a first terminal connected to power supply VCC and a second terminal connected to a gate of ESD detection transistor 3 at a node S0, a resistor 2 having a first terminal connected to the gate of ESD detection transistor 3 at node S0 and to the second terminal of capacitor 1, and a second terminal connected to ground supply VSS. ESD clamp circuit 100 further includes a clamp transistor 7 connected between power supply VCC and ground supply VSS and a core circuitry 10 connected between power supply VCC and ground supply VSS. In an embodiment, clamp transistor 7 is an n-channel transistor having a multi-finger structure and configured to discharge the ESD current. Core circuitry 10 is protected by clamp transistor 7. ESD clamp circuit 100 also includes an inverter 4 having an input terminal connected to a drain of ESD detection transistor 3 at a node S1 and an output terminal connected to a gate of clamp transistor 7 at a node S2.

Referring still to FIG. 1, ESD clamp circuit 100 further includes a feedback transistor 5. Feedback transistor 5 is a p-MOS transistor having a gate connected to the gate of clamp transistor 7 at node S2, a source connected to power supply VCC, and a drain connected to a drain of ESD detection transistor 3 at node S1. ESD clamp circuit 100 also includes a resistor 6 having a first terminal connected to the gate of clamp transistor 7 at node S2 and a second terminal connected to ground supply VSS.

In the event of an ESD occurring at power supply VCC, ESD detection transistor 3 is turned on causing the input of inverter 4 to have the ground supply level voltage. The output of inverter 4 goes high (i.e., node S2 is logic high level) and turns on clamp transistor 7, so that the ESD current flows through clamp transistor 7. When node S2 is driven low by inverter 4, clamp transistor 7 is turned off and the ESD current stops flowing through clamp transistor 7.

In an embodiment, clamp transistor 7 is a very large structure having multiple re-channel transistors connected in parallel and configured to receive an ESD current flowing from VCC to VSS. Clamp transistor 7 controls the power supply VCC to be lower than the breakdown voltage of the ultra thin gate oxide layer of the logic in the core circuitry 10, thereby protecting the core circuitry 10 from ESD damage.

In the embodiment, through the control of the voltage at node S2, clamp transistor 7 can uniformly and sufficiently shunt the ESD current. Node S2 is less sensitive to electrical noise on the power supply line. According to the present invention, the ESD protection circuit does not have a significant impact on other operation conditions of the core circuitry and has a negligible leakage current. In addition, the ESD protection circuit can uniformly and adequately discharge an ESD current.

In the embodiment, feedback transistor 5 may be a p-channel transistor having the gate controlled by the voltage at node S2. Once the voltage difference between node S2 and the power supply VCC reaches the threshold voltage (Vth), feedback transistor 5 is turned on pulling node S1 high. Under normal operating conditions, node S1 is at a high logic level and node S2 (i.e., gate of feedback transistor 5) is a low logic level, so that clamp transistor 7 is quickly turned off.

In the event of an ESD occurring at power supply VCC, the voltage of VCC rises quickly within nanoseconds, ESD detection transistor 3 is turned on, and in competition with feedback transistor 5, quickly turn node S1 to low, the output of inverter 4 (i.e., node S2) changes to a high level and turns off feedback transistor 5. Clamp transistor 7 is turned on to discharge the ESD current to VSS.

At power up, assuming that power supply VCC has a rise time of in the range of about microseconds or milliseconds, the NMOS transistor of inverter 4 is turned on, the PMOS of inverter 4 is turned off, thus driving node S2 low. Feedback transistor 5 is turned on pulling node S1 high. Node S2 is at a low level, which accelerates feedback transistor 5 to pull up node S1 and pull down node S2. Thus, clamp transistor 7 is turned off during the power up event.

In the embodiment, clamp transistor 7 is a large n-channel transistor having a multi-finger structure. There is a parasitic capacitance between the gate oxide layer and the drain terminal. This parasitic capacitance can be used together with resistor 6 to form a gate-coupled circuit configured to uniformly turn on clamp transistor 7 during the an ESD event. Resistor 6 can also be configured to as a bypass path to overcome the excess energy accumulated (stored) in the gate oxide layer.

In the embodiment, capacitor 1 is a coupling capacitor between the VCC power supply and the gate of N-channel transistor 3 and can be used together with resistor 2 to obtain an appropriate time constant to detect ESD pulses. Since there is a competition between feedback transistor 5 and inverter 4, the RC time constant of capacitor 1 and resistor 2 should be larger than the ESD pulse width, but smaller than the power up (rise) time of the power supply VCC.

In an embodiment, ESD detection transistor 3 is an n-channel transistor.

In an embodiment, capacitor 1 may be the parasitic capacitance of an n-channel transistor or of a p-channel transistor.

In an embodiment, capacitor 1 may be a parasitic capacitance of a MOS varactor or parasitic capacitance of a diode.

In an embodiment, resistor 2 connected between the gate of ESD detection transistor 3 and ground supply VSS may be a polysilicon resistor, an NMOS transistor having a gate connected to a high logic level, a PMOS transistor having a gate connected to a low logic level, or a parasitic metal resistor.

In an embodiment, feedback transistor 5 may be a p-channel transistor having a gate connected to the gate of clamp transistor 7, a source connected to power supply VCC and a drain connected to the input terminal of inverter 4. In the normal operation mode, node S2 is at a low logic level so that feedback transistor 5 is turned on pulling node S1 high. In an ESD event where a high voltage pulse occurs at the power supply VCC or when there are noises on the power supply VCC, ESD detection transistor 3 may be turned on by the high pulse voltage or noises at the power supply VCC to pull node S1 low, however, node S1 is still at a high logic level pulling high by feedback transistor 5 until node S2 turns high after the delay time of inverter 4 and turns off feedback transistor 5. Thus, feedback transistor 5 can delay the time of low to high transition of node S2 to control the operation of clamp transistor 7. In other words, by competing the control of the voltage potential of node S1, ESD clamp circuit 100 can control the width of an ESD pulse or the time duration of noise peaks before activate clamp transistor 7 for ESD protection of the core circuitry 10.

In an embodiment, inverter 4 may include any integer number of inverters connected in series to add delay time for activating (triggering) clamp diode 7 in an ESD event. In a specific embodiment, inverter 4 consists of a single inverter to reduce the trigger delay time of clamp transistor 7.

In an embodiment, resistor 6 can be a polysilicon resistor, an NMOS transistor having a gate connected to a high logic level, a PMOS transistor having a gate connected to a low logic level, or a parasitic metal resistor.

Figure 2:
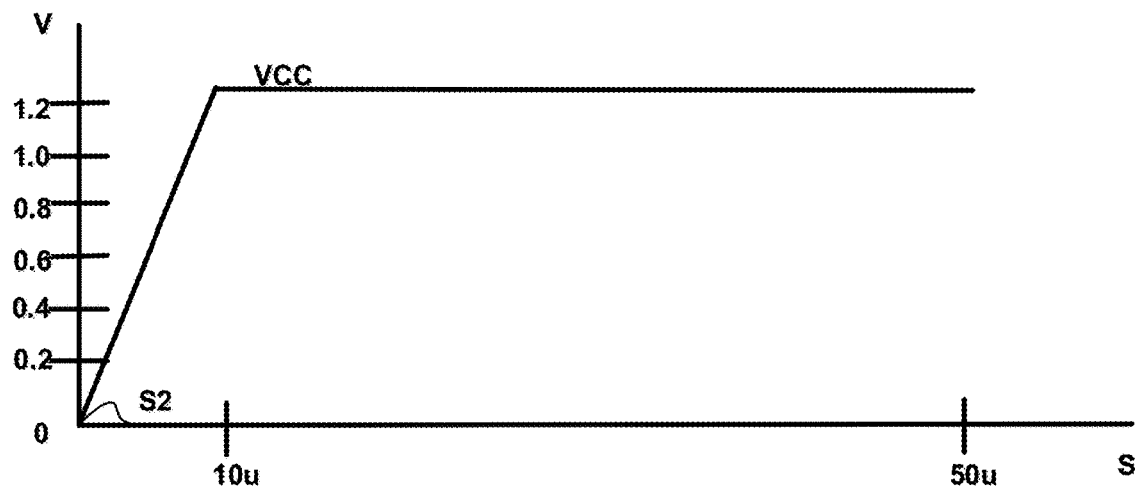
FIG. 2 is a graph of voltage waveforms of the active ESD clamp circuit at power up of FIG. 1.

In accordance with the present invention, an active ESD clamp circuit comprises a clamp transistor connected between the power supply and the ground supply to protect a core circuitry from ESD damage. FIG. 2 is a graph of power supply and internal gate voltage waveforms of an active ESD clamp circuit at power up according to an embodiment of the present invention. As shown, power supply voltage VCC rises from 0 V to 1.21 V in about 10 microseconds (us), the voltage at node S2 rises only to a peak value of about 500 mV (millivolt) then drops to 60 mV (almost to the ground supply level). In other words, at power up, the voltage level at node S2 is almost at ground potential, thus, cannot trigger (turn on) clamp transistor 7.

Figure 3:
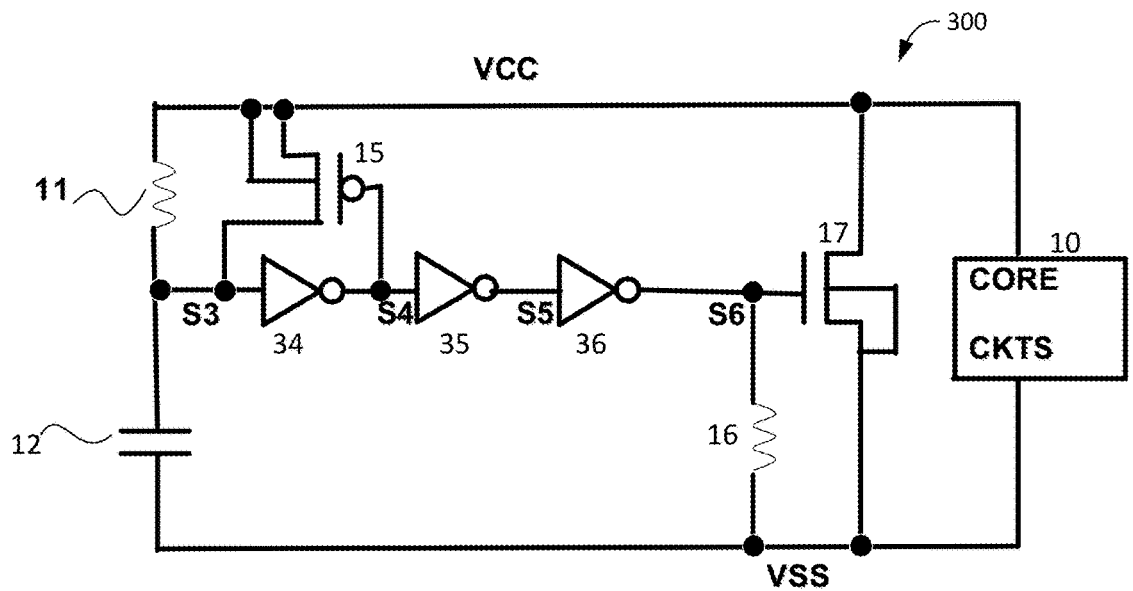
FIG. 3 is a simplified circuit diagram of ESD clamp circuit, as known in the related art.

FIG. 3 is a simplified circuit diagram of an active ESD clamp circuit 300, as known in the related art. ESD clamp circuit 300 is shown as including a power supply VCC, a ground supply VSS, inverters 34, 35, 36, a resistor 11 having a first terminal connected to power supply VCC and a second terminal connected to an input of inverter 34 at a node S3, a capacitor 12 having a first terminal connected to node S3 and a second terminal connected to ground supply VSS, a clamp transistor 17 connected between power supply VCC and ground supply VSS, and a core circuitry 10 connected between power supply VCC and ground supply VSS. Clamp transistor 17 is a large structure having a number of transistors connected in parallel and able to conduct a large current. Core circuitry 10 is protected by clamp transistor 17. Inverters 34, 35, and 36 are connected in series with inverter 34 being the first inverter and inverter 36 being the last inverter. Inverter 36 has an output terminal connected to a gate of clamp transistor 17 at a node S6. ESD clamp circuit 300 also includes a resistor 16 having a first terminal connected to node S6 and a second terminal connected to ground supply VSS.

ESD clamp circuit 300 further includes a feedback transistor 15. Feedback transistor 15 is a p-MOS transistor having a gate connected to an output terminal of inverter at node S4, a source connected to power supply VCC, and a drain connected to the input of inverter 34 at node S3.

Resistor 11 and capacitor 12 together with inverters 34, 35, 36 form an RC ESD trigger circuit configured to trigger clamp diode 17 to conduct an ESD current in an ESD event occurring on power supply VCC.

Figure 4:
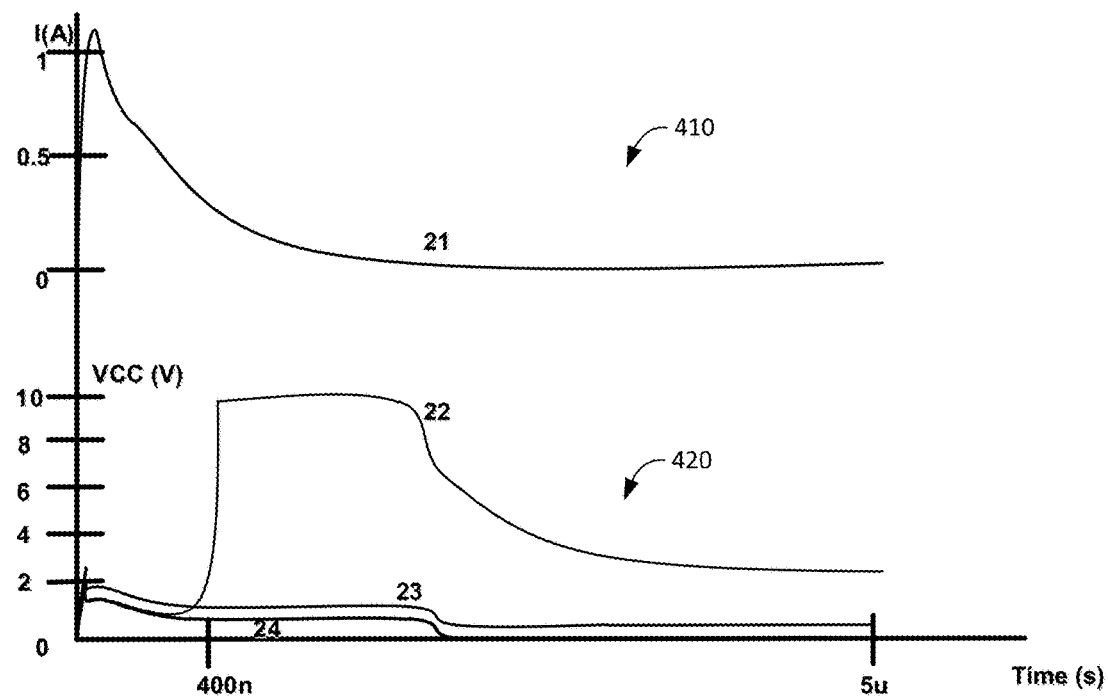
FIG. 4 is a graph illustrating ESD current and voltage waveforms of FIG. 1 and FIG. 3 under the 2 kV human body discharge model.

FIG. 4 is a graph illustrating current and voltage waveforms using the 2 kV HBM (Human Body Model) discharge of FIG. 1 and FIG. 3. FIG. 4 includes a top portion 410 and a bottom portion 420. The vertical axis of the top portion 410 represents the ESD current (in A) of the 2000 V Human Body Model (HBM). The horizontal axis represents time (in second). The HBM has a rise time of 1 to 10 ns and a duration of about 100 ns. Current waveform 21 in the top portion 410 shows that the peak current is over 1 A that may flow from the power supply to the ground supply in an ESD event according to the 2 kV HBM. The vertical axis of the bottom portion 420 represents voltage waveforms of the ESD clamp circuit in FIG. 1 and FIG. 3. Voltage waveform 22 is the VCC voltage waveform of ESD clamp circuit 300 of FIG. 3 during an ESD event. Referring to the bottom portion 420, the portion of waveform 22 from 0 to 400 ns (denoted "400n" in the horizontal axis) shows that the power supply VCC is about 1.3 V (the power supply voltage under the normal operation for a 40 nm node technology). Power supply VCC goes up sharply to about 9 V at time 400 ns caused by a tail of an ESD pulse. The sharply rising power supply voltage may cause damage to the thin gate oxide layers in the core circuitry. The ESD pulse has thus to be filtered out or eliminated by increase the time constant (resistor 11/capacitor 12).

Referring still to FIG. 4, graph 23 represents the ESD clamp circuit 300 of FIG. 3 where the value of resistor 11 has increased multiple times over the original value of resistor 11 shown at waveform at 22 to increase the RC time constant in order to further reduce the ESD pulse. As shown, power supply VCC remains flat at time 400 ns, i.e., the ESD pulse is completely eliminated by the RC circuit, but at the cost of an area increase. In other words, the RC time constant can be made sufficient large to reduce ESD pulses at the cost of a large silicon real estate in FIG. 3.

Voltage waveform 24 represents the power supply VCC of the ESD clamp circuit 100 in FIG. 1 using the same HBM. As can be seen, there is no change to the power supply VCC before the ESD event, at the ESD event or during the ESD event. ESD clamp circuit 100 in FIG. 1 thus provides a safe ESD protection to the core circuitry 10.

In the embodiments described above, an ESD event can be detected by using a resistor/capacitor circuitry. The detected pulse width of an ESD event can be adjusted by varying the value of the resistor and/or the capacitor. The trigger of the clamp transistor can be delayed using a feedback transistor to filter out noises and other short pulses on the power supply. Noises on the power supply may not represent ESD events. Thus, the RC time constant is selected to be sufficiently large so as to filter out short-duration, high-amplitude noise spikes. The RC time constant can be further extended by using multiple inverters connected in series to achieve a uniform discharge of the ESD trailing edge. When the ESD pulse is dissipated, the feedback transistor further enforces the gate level of the clamp transistor to remain low. In an embodiment, the feedback transistor is a p-channel transistor connected across the CMOS inverter. The feedback transistor has a gate connected to the output of the CMOS inverter and a source terminal connected to the power supply VCC and a drain terminal connected to the input of the CMOS inverter pulling the input of the CMOS inverter to the voltage level of the power supply VCC as to force the output of the CMOS inverter to a logic low level. The feedback transistor has the function of a hysteresis to keep the peak leakage current of the clamp transistor to be less than 1 uA (microampere) during the power supply VCC ramp to the normal operation voltage with a rise time of 10 us (microsecond). Therefore, the ESD clamp circuit according to the present invention has a sufficient time constant to discharge the ESD current and a good control to prevent the clamp transistor from turning on during the power supply ramp. The ESD clamp circuit according to the present invention only operates when there is an ESD event and will not affect the normal operation of the core circuitry.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of resistor, capacitor, CMOS inverter, n-channel and p-channel transistors are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. An electrostatic discharge (ESD) clamp circuit comprising:
   a power supply;
   a ground supply;
   an ESD detection transistor;
   a capacitor having a first terminal connected to the power supply and a second terminal connected to a gate of the ESD detection transistor;
   a first resistor being a polysilicon resistor and having a first terminal connected to the gate of the ESD detection transistor and a second terminal connected to the ground supply;
   a clamp transistor comprising a multi-finger structure having a first terminal connected to the power supply and a second terminal connected to the ground supply and configured to shunt a current associated with an ESD pulse;
   an inverter having an input connected to a first terminal of the ESD detection transistor and an output connected to a gate of the clamp transistor;
   a feedback transistor having a gate connected to the gate of the clamp transistor, a first terminal connected to the power supply and a second terminal connected to the first terminal of the ESD detection transistor; and
   a second resistor having a first terminal connected to the gate of the clamp transistor and a second terminal connected to the ground supply,
   wherein the capacitor and the first resistor together form an RC circuit having a time constant smaller than a rise time of the power supply and greater than a width of the ESD pulse.

2. The ESD clamp circuit of claim 1, wherein the ESD detection transistor is an n-channel transistor.

3. The ESD clamp circuit of claim 1, wherein the capacitor is a parasitic capacitance of an n-channel transistor or a parasitic capacitance of a p-channel transistor.

4. The ESD clamp circuit of claim 1, wherein the capacitor is a parasitic capacitance of a metal oxide semiconductor (MOS) varactor or a parasitic capacitance of a diode.

5. The ESD clamp circuit of claim 1, wherein the feedback transistor is a p-channel transistor having the gate connected to the output of the inverter, the second terminal connected to the input of the inverter, the first terminal and a substrate connected to the power supply.

6. The ESD clamp circuit of claim 1, wherein the inverter is a single stage inverter configured to reduce a trigger time of the ESD clamp circuit and increase a turn-on speed of the clamp transistor.

7. The ESD clamp circuit of claim 1, wherein the second resistor is a polysilicon resistor, an NMOS transistor having a gate connected to the power supply, a PMOS transistor having a gate connected to the ground supply, or a parasitic metal resistor.

8. An electrostatic discharge (ESD) clamp circuit, comprising:
   a power supply;
   a ground supply;
   an ESD detection transistor;
   a capacitor having a first terminal connected to the power supply and a second terminal connected to a gate of the ESD detection transistor;
   a first resistor having a first terminal connected to the gate of the ESD detection transistor and a second terminal connected to the ground supply;
   a clamp transistor comprising a plurality of n-channel transistors connected in parallel, each of the n-channel transistors having a drain terminal connected to the power supply and a source terminal connected to the ground supply and configured to shunt a current associated with an ESD pulse;
   an inverter having an input connected to a first terminal of the ESD detection transistor and an output connected to a gate of the clamp transistor;
   a feedback transistor having a gate connected to the gate of the clamp transistor, a first terminal connected to the power supply and a second terminal connected to the first terminal of the ESD detection transistor; and
   a second resistor having a first terminal connected to the gate of the clamp transistor and a second terminal connected to the ground supply,
   wherein the capacitor and the first resistor together form an RC circuit having a time constant smaller than a rise time of the power supply and greater than a width of the ESD pulse.

9. The ESD clamp circuit of claim 8, wherein the capacitor is a parasitic capacitance of an n-channel transistor.

10. The ESD clamp circuit of claim 8, wherein the capacitor is a parasitic capacitance of an MOS varactor.

11. The ESD clamp circuit of claim 8, wherein the capacitor is a parasitic capacitance of a diode.

12. The ESD clamp circuit of claim 8, wherein the plurality of n-channel transistors each comprise a parasitic capacitance between a gate oxide layer and the drain terminal, a sum of the parasitic capacitances forming with the second resistor a gate-coupled circuit configured to uniformly turn on the clamp transistor during an ESD event.

13. The ESD clamp circuit of claim 12, wherein the second resistor is configured to discharge excess energy stored in the gate oxide layer.

14. The ESD clamp circuit of claim 8, wherein the first resistor is a parasitic metal resistor.

* * * * *